United States Patent

Fukukawa et al.

[15] 3,663,874

[45] May 16, 1972

[54] IMPATT DIODE

[72] Inventors: Yukio Fukukawa, Tokyo; Masaichi Shinoda, Sagamihara-shi, both of Japan

[73] Assignee: Fujitsu Limited, Kawasaki, Japan

[22] Filed: Oct. 6, 1969

[21] Appl. No.: 864,015

[30] Foreign Application Priority Data

Oct. 17, 1968 Japan....................................43/75978

[52] U.S. Cl.................317/235 T, 317/235 AL, 317/235 AM

[51] Int. Cl............................................................H01l 5/00

[58] Field of Search.........................317/235, 25, 30, 48, 48.1

[56] References Cited

UNITED STATES PATENTS 3,270,293 8/1966 De Loach et al. .....................331/107
3,417,299 12/1968 Dixon et al. ...........................317/234
3,465,159 9/1969 Stern ....................................250/213
3,403,306 9/1968 Haitz et al.............................317/235
3,309,241 3/1967 Dickson...............................148/33.5

*Primary Examiner*—John W. Huckert
*Assistant Examiner*—E. Wojciechowicz
*Attorney*—Curt M. Avery, Arthur E. Wilfond, Herbert L. Lerner and Daniel J. Tick

[57] ABSTRACT

A high resistance semiconductor epitaxial layer of opposite conductivity type is provided on a lower resistance semiconductor substrate of one conductivity type. A first diffusion layer of the one conductivity type and of cylindrical configuration extends through the epitaxial layer from the substrate in a limited area. A second diffusion layer of the opposite conductivity type and of disc-like configuration extends from the outer surface of the first diffusion layer a limited distance into the first diffusion layer in a manner whereby the junction between the first and second diffusion layers is planar and is embedded in the diode and has a breakdown voltage which is lower than that of the junction between the substrate and the epitaxial layer. Avalanche breakdown occurs substantially at the junction between the first and second diffusion layers.

4 Claims, 2 Drawing Figures

IMPATT DIODE

DESCRIPTION OF THE INVENTION

Figure 1:
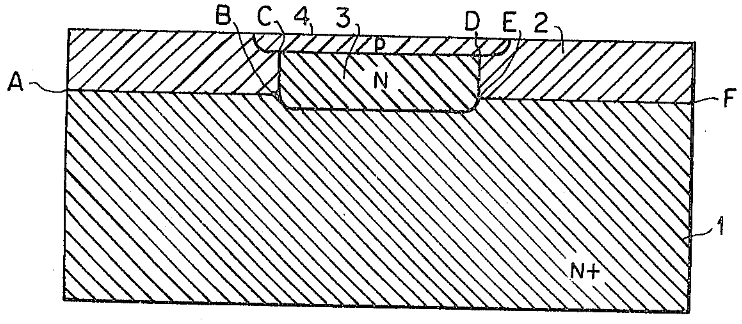

The invention relates to an IMPATT diode. More particularly, our invention relates to a semiconductor IMPATT diode.

An IMPATT diode is an impact avalanche and transit time diode. The first three letters of the name are the first three letters of the work impact, the fourth letter of the name is the first letter of the word avalanche and the last two letters of the name are the first letters of the words transit and time. The IMPATT diode is presently replacing the reflex klystron as a solid state microwave generator in microwave radio systems. The principle of operation involves the combination of avalanche current multiplication and transit time delay to produces negative resistance at microwave frequencies. It is sufficient to cause uniform avalanche breakdown in the vicinity of a reverse-biased PN junction in order to improve the efficiency and reduce the adverse effects of noise.

The mesa type has conventionally been considered to be more advantageous than the planar type in producing uniform avalanche breakdown within the junction region and improving break-down voltage. In the planar type, the surface is normally covered with silicon dioxide, so that a high electrical field tends to be formed on such surface due to ionization, distortion, and so on. The breakdown in initiated by the high electrical field. Furthermore, due to the junction configuration in the planar type, the electrical field is concentrated in the curved portion to accelerate the breakdown.

The mesa type, although it is free from the aforedescribed defects inherent in a planar structure, is apt to be effected by ambient conditions and is unreliable because its junction is exposed. For these reasons, it has been proposed to provide a guard ring structure for planar type devices. It has also been proposed to provide a protective coating for mesa type devices.

Another important problem of the IMPATT diode is that of the reduction of thermal resistance. The output oscillations of the IMPATT diode are considerably reduced by an increase in temperature. Even a slight variation in thermal resistance sufficiently effects the output.

The principal object of the invention is to provide a new and improved IMPATT diode.

An object of the invention is to provide a solid state microwave generator having a junction which provides uniform avalanche breakdown.

An object of the invention is to provide an IMPATT diode which produces microwave oscillations having millimeter wavelengths.

An object of the invention is to provide a IMPATT diode in which the junction region is embedded.

An object of the invention is to provide an IMPATT diode in which uniform avalanche breakdown occurs in the area of the junction.

An object of the invention is to provide an IMPATT diode in which uniform avalanche breakdown occurs at the principal operating region of the junction plane, which junction plane is embedded in the semiconductor, so that it is protected from atmosphere contamination.

An object of the invention is to provide an IMPATT diode which may be mounted on a heat sink in order to reduce the thermal resistance from the junction of the principal operating region, when such junction is reverse-biased and generates a high heat.

In accordance with the present invention, an IMPATT diode comprises a low resistance semiconductor substrate of one conductivity type. A high resistance semiconductor epitaxial layer on the substrate is of opposite conductivity type from the substrate. A first diffusion layer of the one conductivity type and of substantially cylindrical configuration extends through the epitaxial layer from the substrate in a limited area. A second diffusion layer of the opposite conductivity type and of substantially disc-like configuration extends from the outer surface of the first diffusion layer a limited distance into the first diffusion layer in a manner whereby the junction between the first and second diffusion layers is substantially planar and is embedded in the diode and has a breakdown voltage which is lower than that of the junction between the substrate and the epitaxial layer. Avalanche breakdown occurs substantially at the junction between the first and second diffusion layers.

The one conductivity type is N conductivity type and the opposite conductivity type is P conductivity type. The semiconductor substrate comprises silicon.

The first diffusion layer extends a limited distance into the substrate. The second diffusion layer has a diameter greater than that of the first diffusion and the first and second diffusion layers are coaxially positioned.

The breakdown voltage of the PN junction between the first and second diffusion layers is selected at a level lower than that of the planar annular junction formed between the semiconductor substrate and the epitaxial layer, and at a level corresponding to the breakdown voltage of the IMPATT diode. That is, the avalanche breakdown of the diode occurs substantially uniformly and concentrated, in the vicinity of the planar embedded junction area between the first and second diffusion layers. The principal operating region or area of the diode is thus limited to an area within the semiconductor itself.

The junction formed between the semiconductor substrate and the epitaxial layer is exposed at the side wall of the substrate, although the exposed portions may be covered with a protective coating such as, for example, a silicon oxide film, in order to prevent ambient conditions from adversely influencing the diode. The PN junction is extended to neither the substrate surface nor the surface of the epitaxial layer. Consequently, the epitaxial layer may safely contact a heat sink body when the diode is mounted on such a body. Thus, "upside-down bonding" is feasible. In this case, the thermal resistance from the principal operating area to the heat sink body is considerably reduced. In a conventional mesa type device, the heat generated from the reverse-biased junction is dissipated only through the mesa portion. In the diode of our invention, however, the heat may be dissipated through the epitaxial layer around the principal operating area, so that temperature increases at the junction may be alleviated.

Figure 2:
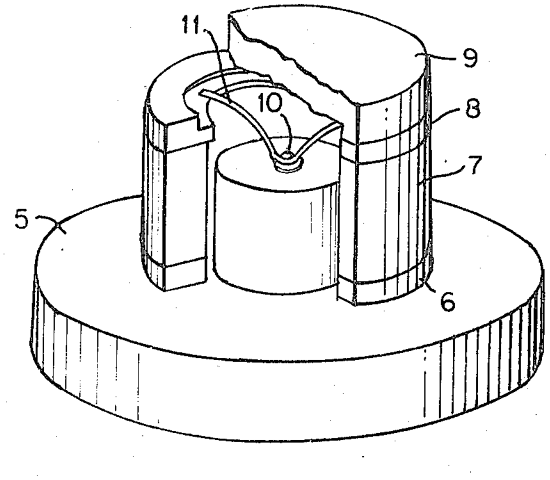

In order that our invention may be readily carried into effect, it will now be described with reference to the accompanying drawing, wherein:

FIG. 1 is an axial cross-sectional view of an embodiment of the IMPATT diode of the invention; and FIG. 2 is a perspective view of the IMPATT diode of our invention in a housing structure.

In FIG. 1, a low resistance silicon substrate 1 has a specific resistance of not more than 0.01 ohm cm and is doped with antimony. A silicon epitaxial layer 2 is provided on the upper surface of the substrate 1. The epitaxial layer 2 is doped with not more than $10^{15}$ $cm.^{-3}$ of boron. The epitaxial layer 2 has an axial thickness of 4.5 microns. The substrate 1 is of N+ conductivity type and the epitaxial layer 2 is of P conductivity type.

Phosphorus is diffused from the surface of the epitaxial layer 2 by any known process of selective diffusion, to form a first diffusion layer 3. The first diffusion layer 3 is of N conductivity type and is of substantially cylindrical configuration extending through the epitaxial layer 2 from the substrate in a limited area. The first diffusion layer 3 is coaxial with the substrate 1 of the epitaxial layer 2 and has a considerably smaller diameter than do said substrate and epitaxial layer. The outer surface of the first diffusion layer has a diameter of 150 microns and a surface concentration of approximately $10^{17}$ $cm.^{-3}$.

A second diffusion layer 4 of P conductivity type and of substantially disc-like configuration is provided in the first diffusion layer 3 and the epitaxial layer 2. The second diffusion layer 4 extends from the outer surface of the first diffusion layer 3 a limited distance into said first diffusion layer. The second diffusion layer 4 is coaxial with the first diffusion layer 3 and has a diameter of 170 microns, so that it extends beyond said first diffusion layer into the epitaxial layer 2. The second diffusion layer 4 has a depth of 1 micron.

The second diffusion layer 4 may be formed by any known selective diffusion process. Boron may be utilized as the doping impurity. The surface concentration of boron is approximately $10^{19}$ cm.$^{-3}$.

The junction in the diode of FIG. 1 is ABCDEF. The PN junction CD between the first and second diffusion layers 3 and 4 is substantially planar and is embedded in the diode. The PN junction CD is of circular configuration. The PN junction ABEF between the substrate 1 and the epitaxial layer 2 is substantially planar and of annular configuration. The PN junction BCDE between the first diffusion layer 3 and the epitaxial layer 2 is of cylindrical configuration.

The breakdown voltage of the junction area CD between the first and second diffusion layers 3 and 4 is lower than that of the junction area between the substrate 1 and the epitaxial layer 2. The breakdown voltage of the junction area CD is thus approximately 70 volts and the breakdown voltage of the ABEF junction area is approximately 300 volts. Consequently, stable avalanche breakdown predominently occurs at the junction CD between the first and second diffusion layers 3 and 4 and the effective operating area of the diode is embedded in said diode and is thus limited to within said diode. This protects the effective operating area from the outside atmosphere.

The diode of the invention may be regarded as a P+NN+ diode or a P+NIN+ diode, depending upon the distribution of the dopant concentration. The diode of the embodiment of FIG. 1 is an X-band IMPATT diode.

As hereinbefore mentioned, the diode of the invention may be bonded upside-down with a heat sink body. When the diode is so bonded, the CD junction, which is reverse-biased by the operating voltage and which generates a considerable amount of heat, may be positioned very close to the heat sink body and the thermal resistance is thus considerably reduced. The reduction of the thermal resistance results in a reduction of the temperature increase at the CD junction and the output of the diode may thus be substantially improved.

FIG. 2 discloses a diode of the invention in a housing in which said diode is bonded upside-down with a heat sink body. In FIG. 2, a gold plated copper pedestal base 5 functions as the heat sink body. A metal member 6 is affixed to the base 5 and is hermetically sealed with said base. A ceramic tube 7 and a metal member 8 are affixed to the metal member 6 and are hermetically sealed therewith. An end cap 9 is hermetically sealed with the metal member 8. A gold ribbon lead 11 extends from the diode 10.

Although the diode of our invention is described as comprising silicon, germanium or compounds of the group $A^{III}B^{V}$ of the periodic table such as, for example, gallium-arsenide, and so on, may be utilized instead of silicon. Since the substrate 1 comprises a low resistance semiconductor of N conductivity type, the diode of FIG. 1 is a Read or P+NN+ diode. If the substrate were a low resistance semiconductor of P conductivity type, the diode would be a N+PP+ or N+PIP+ diode.

While the invention has been described by means of a specific example and in a specific embodiment, we do not wish to be limited thereto, for obvious modifications will occur to those skilled in the art without departing from the spirit and scope of the invention.

We claim:

1. An IMPATT diode, comprising
a low resistance semiconductor substrate of one conductivity type having a flat surface and an opposite surface;
a semiconductor epitaxial layer formed on the flat surface of the substrate, said epitaxial layer being of high resistance and of opposite conductivity type from said substrate;
a first diffusion layer of the same conductivity type as the substrate extending from the substrate a specific distance into the epitaxial layer,
a second diffusion layer of the same conductivity type as the epitaxial layer and having a higher impurity concentration than the epitaxial layer and of substantially disc-like configuration, the second diffusion layer being coaxially positioned with said first diffusion layer and having a diameter greater than that of said first diffusion layer and ends within the epitaxial layer in contact with the first diffusion layer and having a flat and embedded junction part formed within the epitaxial layer by the first and second diffusion layers thereby having a breakdown voltage lower than the breakdown voltage of the other junction parts whereby the avalanche occurs substantially in the flat and embedded junction part;
a heat sink bonded to the surface of the epitaxial layer; and
electrical means extending from the opposite surface of the semiconductor substrate.

2. An IMPATT diode as claimed in claim 1, wherein said one conductivity type is N conductivity type and said opposite conductivity type is P conductivity type.

3. An IMPATT diode as claimed in claim 1, wherein said semiconductor substrate comprises silicon.

4. An IMPATT diode as claimed in claim 1, wherein said first diffusion layer extends a limited distance into said substrate.

* * * * *